(12) United States Patent
Yoo et al.

(10) Patent No.: US 11,069,777 B1
(45) Date of Patent: Jul. 20, 2021

(54) MANUFACTURING METHOD OF SELF-ALIGNED DMOS BODY PICKUP

(71) Applicant: Monolithic Power Systems, Inc., San Jose, CA (US)

(72) Inventors: Ji-Hyoung Yoo, Los Gatos, CA (US); Joel McGregor, Issaquah, WA (US); Haifeng Yang, Chengdu (CN); Deming Xiao, Los Altos Hills, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 16/896,885

(22) Filed: Jun. 9, 2020

(51) Int. Cl.
*H01L 29/08* (2006.01)
*H01L 29/66* (2006.01)

(52) U.S. Cl.
CPC .... *H01L 29/0852* (2013.01); *H01L 29/66689* (2013.01); *H01L 29/66704* (2013.01)

(58) Field of Classification Search
CPC .......... H01L 29/0852; H01L 29/66689; H01L 29/66704
See application file for complete search history.

(56) References Cited

U.S. PATENT DOCUMENTS

| | | | | |
|---|---|---|---|---|
| 5,684,319 A * | 11/1997 | Hebert | ................ | H01L 29/7802 257/336 |
| 6,252,278 B1 * | 6/2001 | Hsing | ................ | H01L 29/0878 257/335 |
| 6,518,138 B2 | 2/2003 | Hsing | | |
| 8,546,879 B2 | 10/2013 | Disney et al. | | |
| 9,159,795 B2 | 10/2015 | Yoo et al. | | |
| 9,502,251 B1 | 11/2016 | McGregor et al. | | |
| 9,893,170 B1 | 2/2018 | Yoo et al. | | |
| 9,935,176 B1 | 4/2018 | Yoo et al. | | |
| 9,941,171 B1 | 4/2018 | Yoo et al. | | |
| 2005/0054167 A1 * | 3/2005 | Choi | ................ | H01L 29/66833 438/287 |
| 2012/0168861 A1 * | 7/2012 | Seok | ................ | H01L 29/66681 257/335 |
| 2019/0013383 A1 * | 1/2019 | Tang | ................ | H01L 29/1608 |
| 2021/0036112 A1 * | 2/2021 | Xu | ................ | H01L 29/42368 |

* cited by examiner

*Primary Examiner* — Syed I Gheyas
(74) *Attorney, Agent, or Firm* — Perkins Coie LLP

(57) ABSTRACT

A manufacturing process of a DMOS device in a drift region in a semiconductor substrate, having: forming a polysilicon layer above the drift region; forming a block layer above the polysilicon layer; etching both the block layer and the polysilicon layer, through a window of a first masking layer to expose a window to the drift region; implanting dopants through the window to the drift region to form a body region; forming blocking spacers to wrap side walls of the polysilicon layer; implanting dopants into the body region under a window shaped by the blocking spacers to form a body pickup region; etching away the blocking spacers; performing a masking step to form gates; forming ONO spacers to wrap side walls of the gates; and performing a masking step to form source regions and drain pickup regions.

18 Claims, 6 Drawing Sheets

MANUFACTURING METHOD OF SELF-ALIGNED DMOS BODY PICKUP

TECHNICAL FIELD

The present invention generally relates to semiconductor devices, and more particularly but not exclusively relates to methods for fabricating Double-diffused Metal Oxide Semiconductor (DMOS) devices.

BACKGROUND

DMOS devices are widely adopted for high breakdown voltage, high current and good thermal performance in many applications including notebook, server, and DC/DC converter.

A DMOS device comprises a drift region 16, a drain pickup region 11, a source region 12, a gate 13, a body region 14, and a body pickup region 15 as shown in FIG. 1. For performance and cost reasons, many modern applications require smaller power devices in a smaller package. Much focus has been placed on drain engineering that includes RESURF (Reduced Surface Field), graded doped drain. Another area of focus is on making source region smaller. As shown in FIG. 1, a source/body region consists of the body pickup region 15 in the center and the source region 12 located on both sides of the body pickup region 15, which form an N+/P+/N+ region. Reducing the N+/P+/N+ region would result in a smaller source region. But usually the minimum area of the N+/P+/N+ is limited by the photo/masking equipment's capability.

Also, in a highly competitive market, the DMOS fab manufacturing cost becomes important. Reducing the number of fab masking steps greatly helps.

SUMMARY

It is an object of the present invention to provide a process defining N+/P+/N+ source/body pickup region by using spacers and gate blocking method instead of using photo/masking steps. As a result, the present invention achieves reduced source regions of a DMOS device and significant reduction of the cost for making DMOS devices. The present invention requires no state of the art, most advanced photo/masking equipment.

The embodiments of the present invention are directed to a manufacturing process of a DMOS device in a drift region of a first doping type in a semiconductor substrate, comprising: forming a polysilicon layer above the drift region; forming a block layer above the polysilicon layer; etching both the block layer and the polysilicon layer, through a window of a first masking layer to expose a window to the drift region; implanting dopants of a second doping type through the window to the drift region to form a body region; forming blocking spacers to wrap side walls of the polysilicon layer in a window of the polysilicon layer which is formed after etching; implanting dopants of the second doping type into the body region under a window shaped by the blocking spacers to form a body pickup region; etching away the blocking spacers; performing a masking step to form gates; forming ONO spacers to wrap side walls of the gates; and performing a masking step to form source regions and drain pickup regions.

The embodiments of the present invention are also directed to a method for fabricating a DMOS device, comprising: etching a polysilicon layer above a drift region in a semiconductor substrate through windows for a body region; forming body regions through windows of the polysilicon layer which are formed after etching the polysilicon layer; forming blocking spacers at side walls of the polysilicon layer in the windows of the polysilicon layer which are formed after etching the polysilicon layer; forming body pickup regions through windows shaped by the blocking spacers; forming gates by a masking step after etching away the blocking spacers; and forming source regions and drain pickup regions by a masking step.

The embodiments of the present invention are further directed to a manufacturing process of a DMOS device, comprising: forming a drift region in a semiconductor substrate; depositing a polysilicon layer above the drift region; depositing a silicon nitride layer above the polysilicon layer; etching both the silicon nitride layer and the polysilicon layer, through a window of a first masking layer to expose a window to the drift region; implanting P type dopants through the window to the drift region to form a body region; forming silicon nitride spacers to wrap side walls of the polysilicon layer in a window of the polysilicon layer which is formed after etching; implanting P type dopants into the body region under a window shaped by the silicon nitride spacers to form a body pickup region; etching away the silicon nitride spacers; performing a masking step to form a gate; forming ONO spacers to wrap side walls of the gates; and performing a masking step to form source regions and drain pickup regions.

BRIEF DESCRIPTION OF THE DRAWINGS

The present invention can be further understood with reference to the following detailed description and the appended drawings, wherein like elements are provided with like reference numerals. The drawings are only for illustration purpose. They may only show part of the devices and are not necessarily drawn to scale.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

The terms "left," right," "in," "out," "front," "back," "up," "down, "top," "atop", "bottom," "over," "under," "beneath," "above," "below" and the like in the description and the claims, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein.

Figure 2:
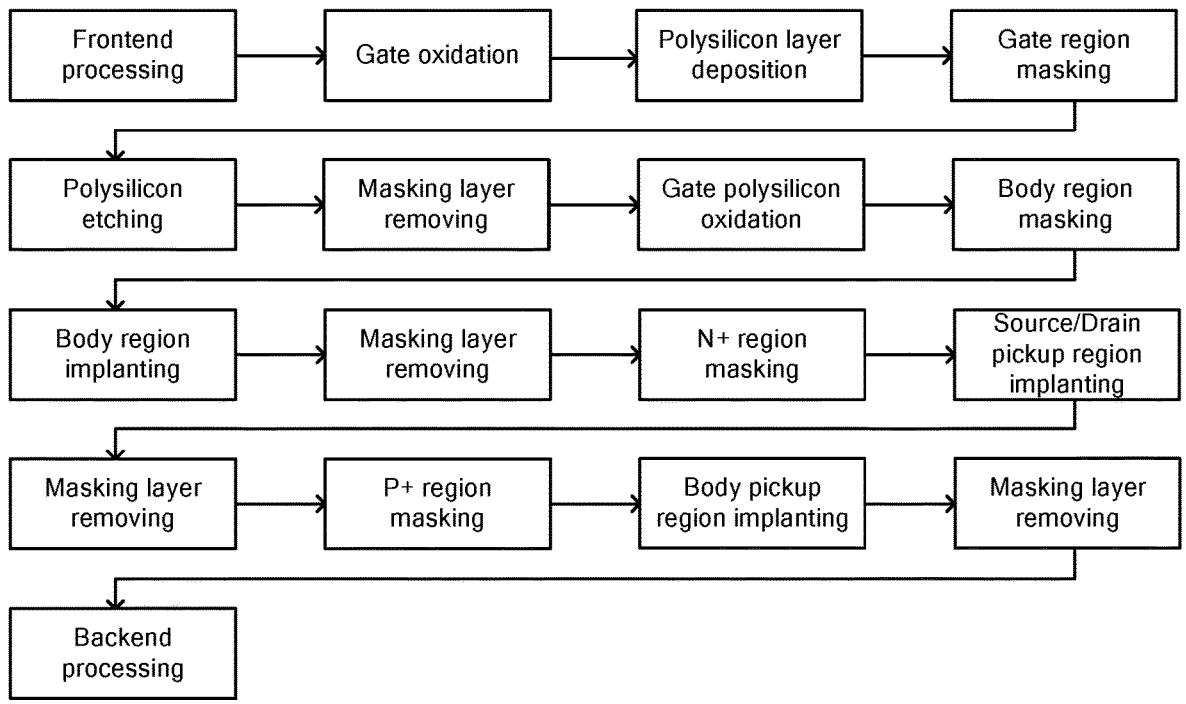
FIG. 2 shows a process flowchart outlining a prior art manufacturing process that could be used to fabricate the DMOS device.

FIG. 2 shows a process flowchart outlining a prior art manufacturing process that could be used to fabricate a DMOS device. The prior art manufacturing process may comprise steps of a frontend processing, gate oxidation, polysilicon layer deposition, gate region masking, polysilicon etching, masking layer removing, gate polysilicon oxidation, body region masking, body region implanting, masking layer removing, N+ region masking, source/drain region implanting, masking layer removing, P+ region masking, body pickup region implanting, masking layer removing and a backend processing. The frontend processing may comprise preparing an original substrate, forming N type buried layer (NBL), growing epitaxial layer (EPI), defining active areas. And in some applications, the frontend processing further comprises forming a thick gate oxidation layer. Backend processing may comprise forming electrodes for the source region, the drain pickup region, the body pickup region and the gate, and then distributing metal layer. Persons of ordinary skill in the art should know that a masking step, e.g., gate region masking, means to form a masking layer with certain windows for determined areas on a top surface of a whole semiconductor substrate. For example, step of body region masking comprises forming a masking layer on the top surface of the whole semiconductor substrate, patterning the masking layer to form windows to the body regions in the semiconductor substrate. The masking layer may comprise a photoresist layer.

Figure 1:
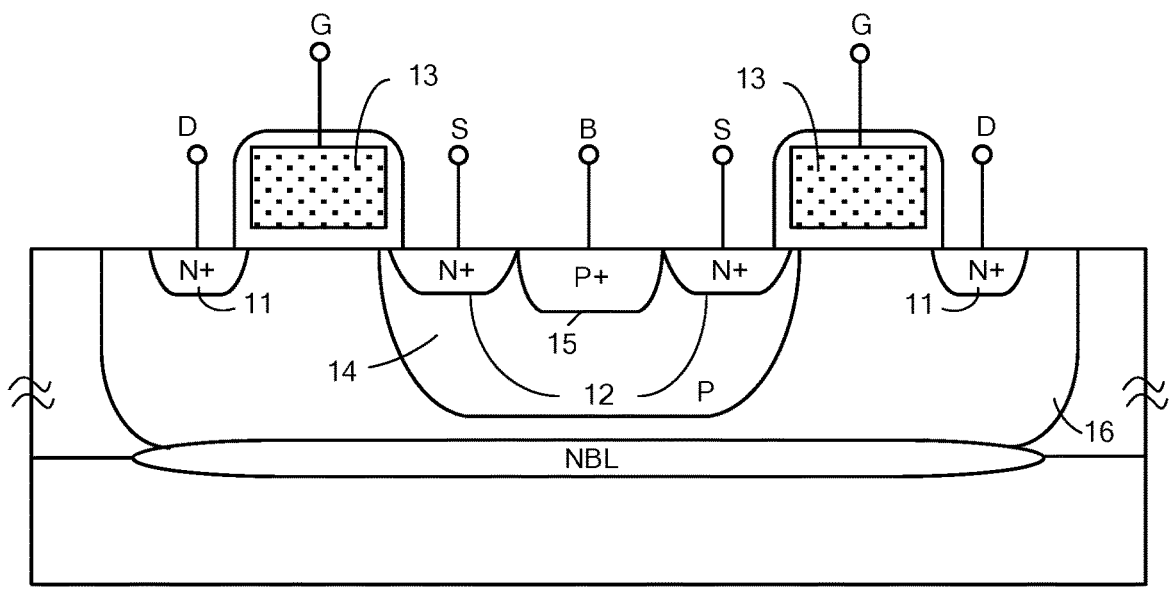
FIG. 1 shows a prior art DMOS device.

As can be seen from FIG. 2, the body region, the body pickup region and the source/drain region are formed by traditional photo-masking and ion-implantation technique. As a result, a window for the source/body region, i.e., the N+/P+/N+ region in FIG. 1 would apparently limited by the photo-masking equipment's capability.

FIGS. 3A-I illustrate a process to fabricate a DMOS device with less masking steps in accordance with an embodiment of the present invention.

Figure 3A:
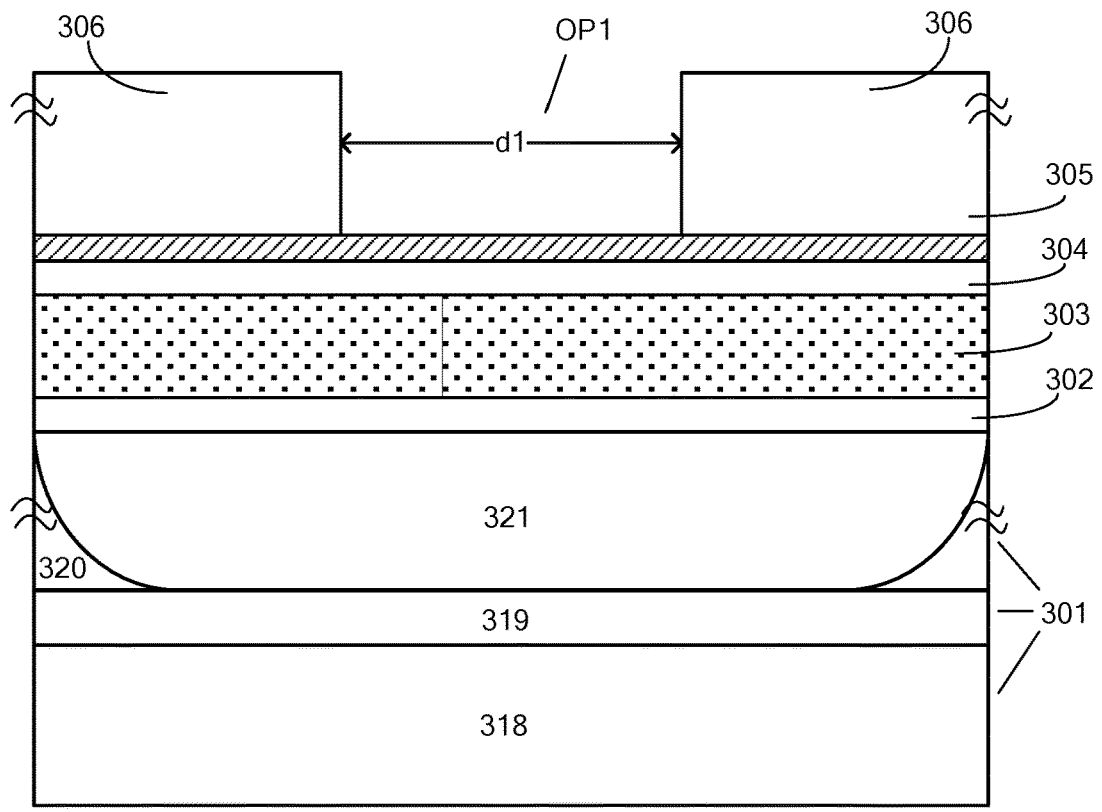
FIGS. 3A~I illustrate a process of fabricating the DMOS device in accordance with an embodiment of the present invention.

In FIG. 3A, a semiconductor substrate 301 is provided. The semiconductor substrate 301 comprises an original substrate 318, an N type Buried Layer (NBL) 319, an epitaxial layer 320 and a drift region 321. The drift region 321 is also referred as the drain drift region. The original substrate 318 may be N type, P type or intrinsic semiconductor material. The NBL 319 may be replaced with other structures. The epitaxial layer 320 may be N type, P type or intrinsic semiconductor material. The drift region 321 may be a high voltage well with light doping concentration. The DMOS device will be formed in the drift region 321. The semiconductor substrate 301 may have other circuit(s)/device(s)/system(s) integrated in it. For example, in a BCD process, several devices, e.g., BJT (Bipolar Junction Transistor), CMOS (Complemented MOS devices), and so on would be integrated with DMOS in a same substrate. In some embodiments, the semiconductor substrate may have other configuration or without some of the aforementioned regions. In FIG. 3A, a gate oxidation layer 302 is formed on a top surface of the semiconductor substrate 301. Next, on a top surface of the gate oxidation layer 302, polysilicon deposition is performed to form a polysilicon layer 303 which is later patterned as a gate of the DMOS device by etching via a masking layer. Then, an oxidation process or oxide deposition process is performed on a top surface of the polysilicon layer 303 to form a part of a gate seal layer 304. After that, a silicon nitride layer 305 is deposited on a top surface of the gate seal layer 304. Next, a masking layer 306 on a top surface of the silicon nitride layer 305 is formed by performing a lithographic process. The masking layer 306 comprises at least a window OP1 through to the top surface of the silicon nitride layer 305. The window OP1 is also referred as a source/body window and may be formed by dissolved a defined area in masking layer 306 after exposure to light. A width of the window OP1 may be in a range of 0.3 μm-0.6 μm. In one embodiment, a width d1 of the window OP1 may be in a range of 0.5 μm-0.6 μm.

The gate oxidation layer 302 is adopted as a dielectric layer and the polysilicon layer 303 is adopted as an electric conducting layer of the gate of the DMOS device. Persons of ordinary skill in the art should know that the gate oxidation layer 302 and the polysilicon layer 303 may be replaced by other proper material.

In FIGS. 3B-I, the original substrate 318, the NBL 319 and the epitaxial layer 320 are not shown for clarity.

Figure 3B:
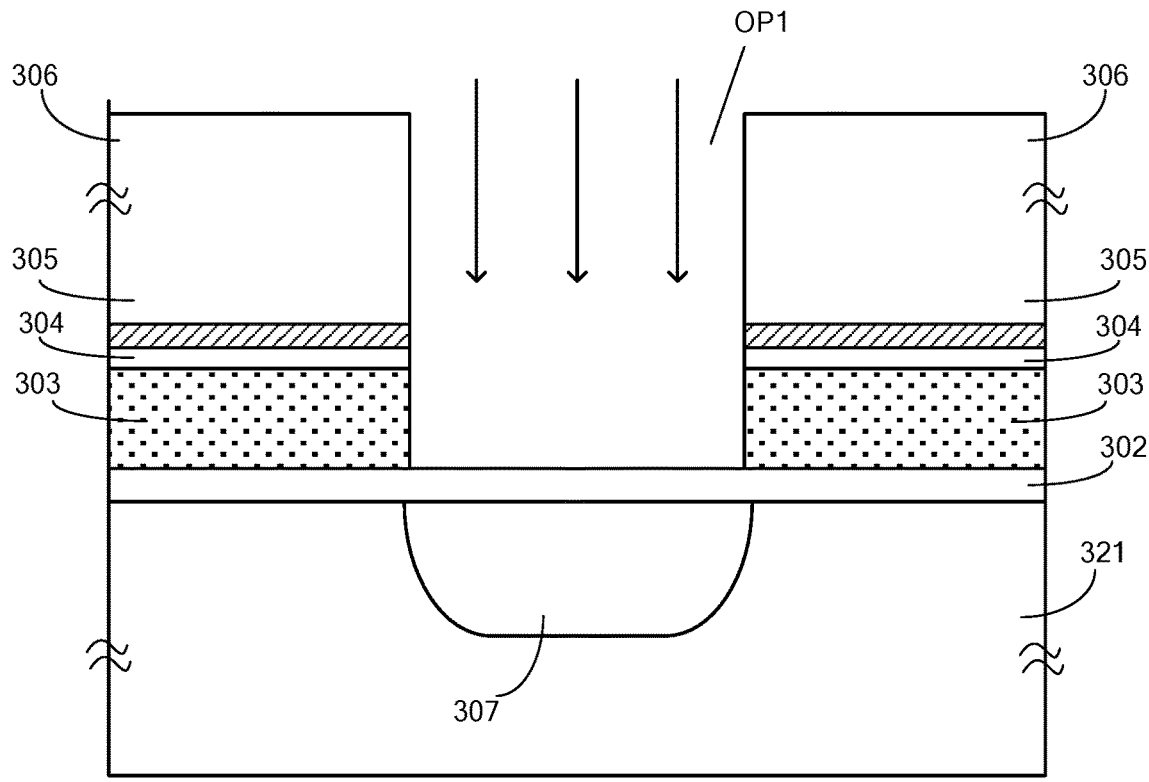

In FIG. 3B, the silicon nitride layer 305, the gate seal layer 304 and the polysilicon layer 303 are etched through the window OP1 to expose a surface of the drift region 321 covered with gate oxidation layer 302 for a source/body region. After that, a body region 307 is formed by implanting P type dopants into the drift region 321 under the window OP1. The masking layer 306 is striped after forming the body region 307.

Figure 3C:
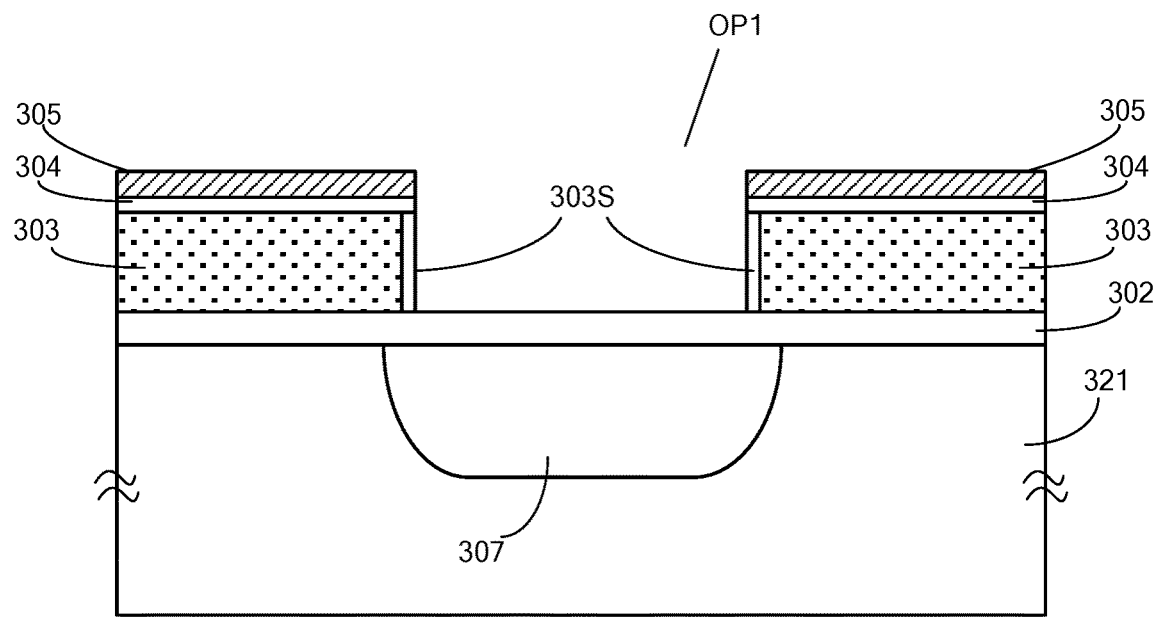

In FIG. 3C, an oxidation process is performed to form the side wall gate seal 303S to wrap the exposed side walls of the polysilicon layer 303 inside the window OP1. The side wall gate seal 303S constitutes part of the gate seal layer 304.

Figure 3D:
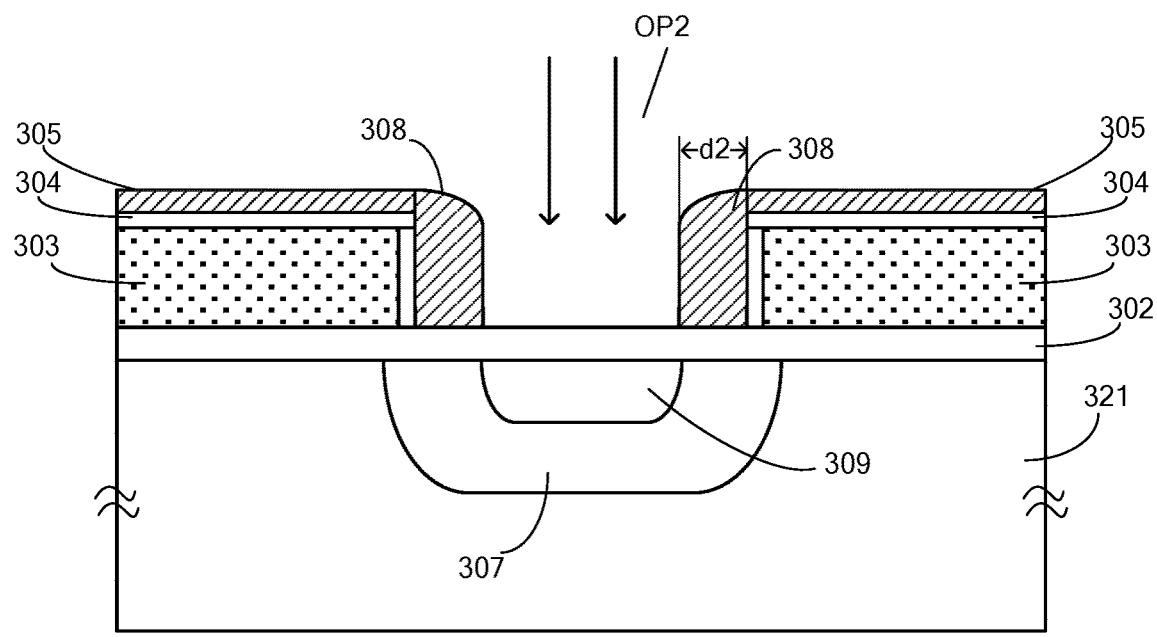

In FIG. 3D, silicon nitride (SiN) blocking spacers 308 are formed to wrap the side gate seals 303S at the side walls of the polysilicon layer 303. The blocking blocking spacers 308 define positions of source regions in the body region 307. Furthermore, the blocking spacers 308 shape a window OP2 for a body pickup region 309 in the body region 307, wherein the window OP2 is also referred as a body pickup region window. The silicon nitride layer 305 and the blocking spacers 308 are adopted as a masking layer for P type dopants implanted into the body region 307 to form the body pickup region 309. The body pickup region 309 is implanted with high energy and has a higher doping concentration than the body region 307.

In the embodiment of FIG. 3D, because the silicon nitride layer 305 and the blocking spacers 308 are adopted as a masking layer, an additional masking layer, e.g., a photoresist layer, for the body pickup region 309 is saved. The silicon nitride layer 305 is also referred as a block layer. In some embodiments, other material with faster etching rate than the gate oxidation layer 302 instead of silicon nitride may be adopted to form the block layer 305.

In one embodiment, the thickness d2 of each blocking spacer 308 as shown in FIG. 3D is in a range of 0.1 μm~0.15 μm.

Figure 3E:
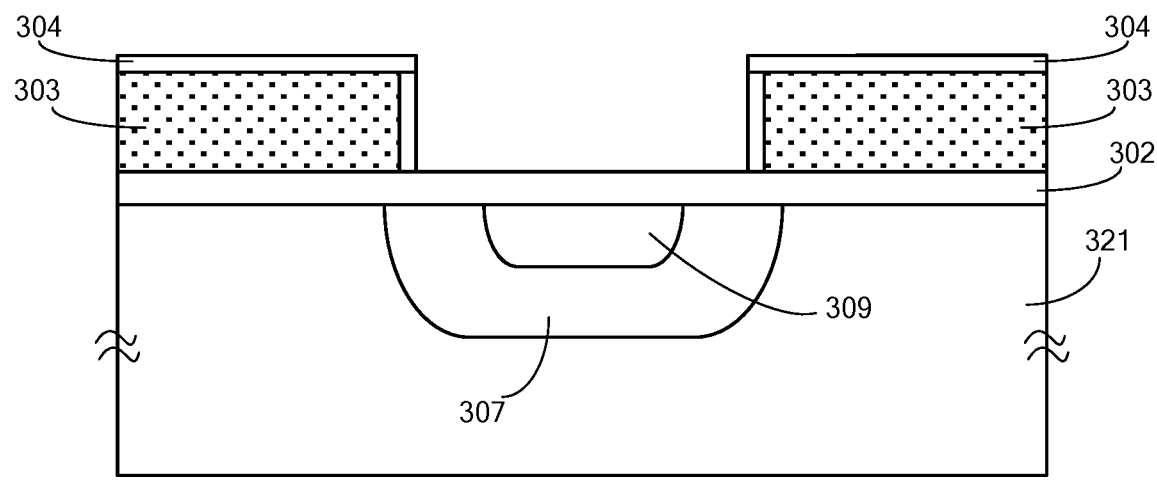

In FIG. 3E, the blocking spacer 308 and the silicon nitride layer 305 are etched away to expose windows OP1 again.

Figure 3F:
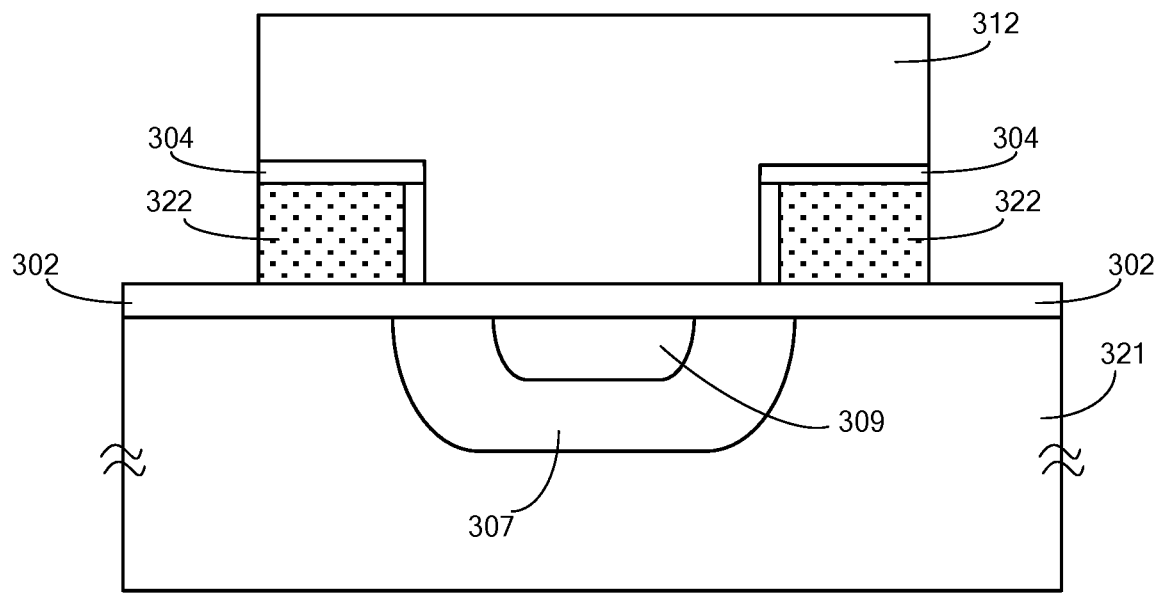

In FIG. 3F, a masking layer 312 is formed by performing the lithographic process. The masking layer 312 comprises positioned windows to pattern the gate. The polysilicon layer 303 is then etched to form gates 322. The masking layer 312 is striped after forming the gate 322. An oxidation process may be performed to complete the gate seal layer 304.

Figure 3G:
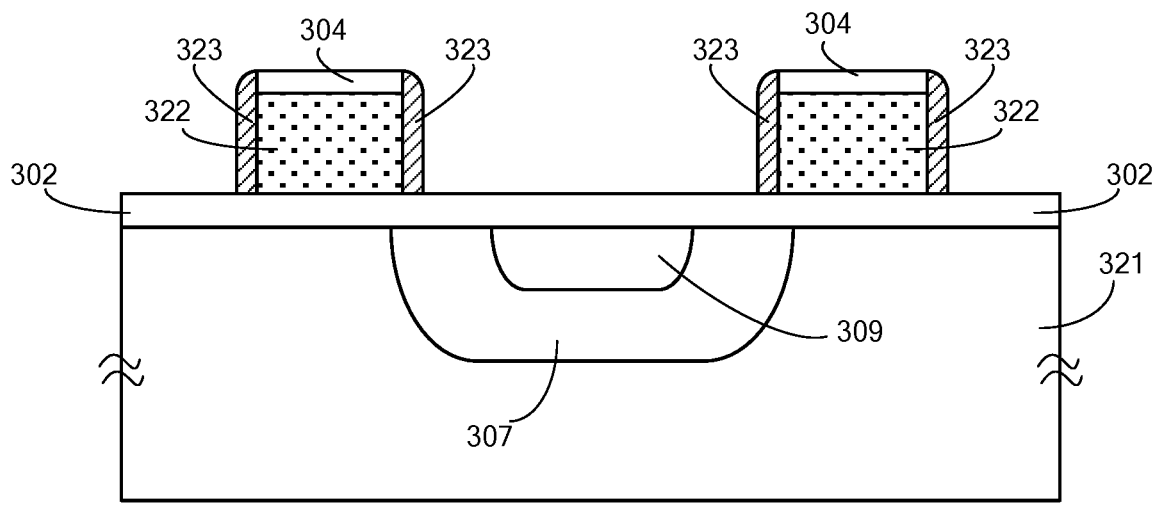

In FIG. 3G, ONO (Oxide-Nitride-Oxide) spacers 323 are formed at the side walls of the gates 322. The ONO spacers 323 could be formed in a conventional way.

Figure 3H:
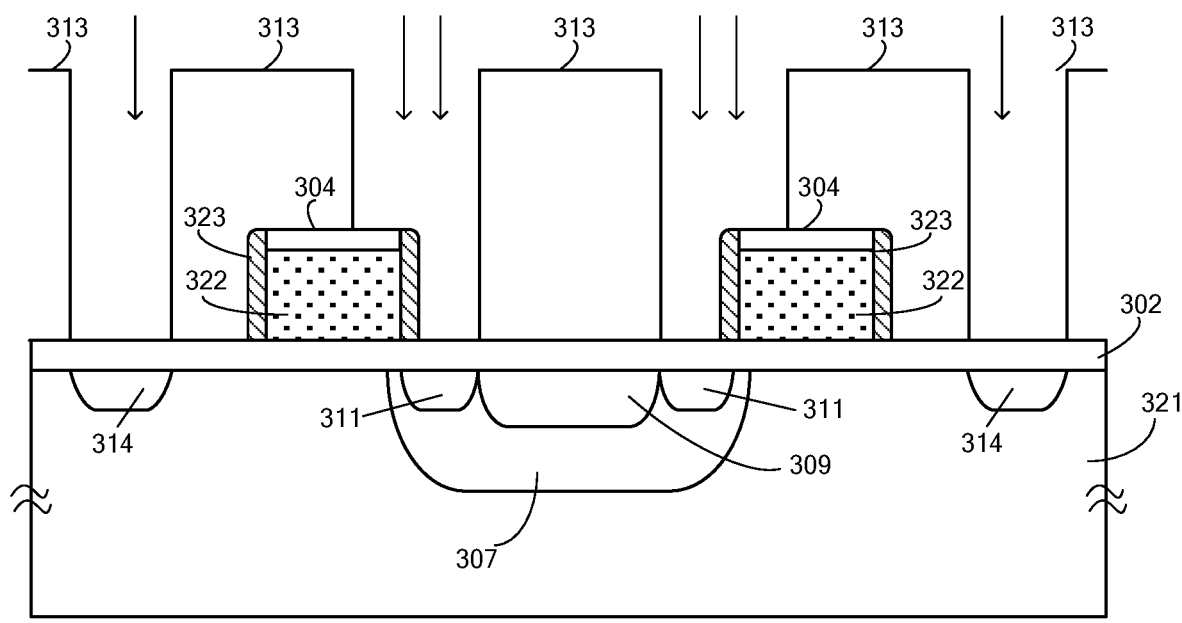

In FIG. 3H, a masking layer 313 is formed by performing the lithographic process. The masking layer 313 comprises positioned windows to define source regions 311 and drain pickup regions 314 of DMOS device. The masking layer 313 is formed also for NMOS's N+ source and drain pickup region, and other N+ layers like NPN bipolar transistor's emitter region and collector region. The source regions 311 are formed by implanting N type dopants into the body region 307, and the drain pickup regions 314 are formed by implanting N type dopants into the drift region 321. As can be seen from FIG. 3H, the area of the source regions 311 are defined by both the windows of the masking layer 313 and the gates 322. That is to say, the gates 322 serve as part of a blocking layer to form the source regions 311. In this way, small area source regions could be formed without limitation of the photo/masking equipment's capability.

Figure 3I:
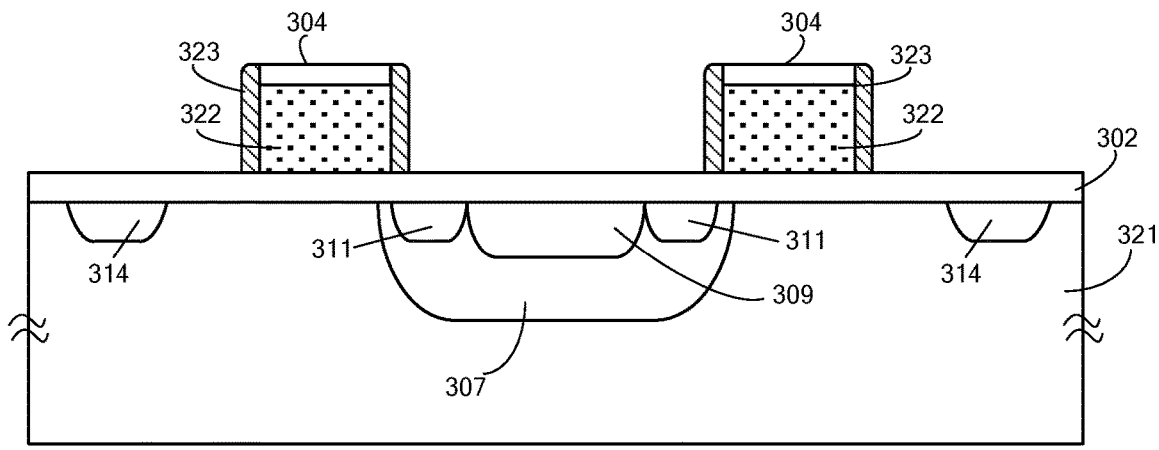

The masking layer 313 is striped after forming the source regions 311 and the drain pickup region 314, which is shown in FIG. 3I.

Figure 4:
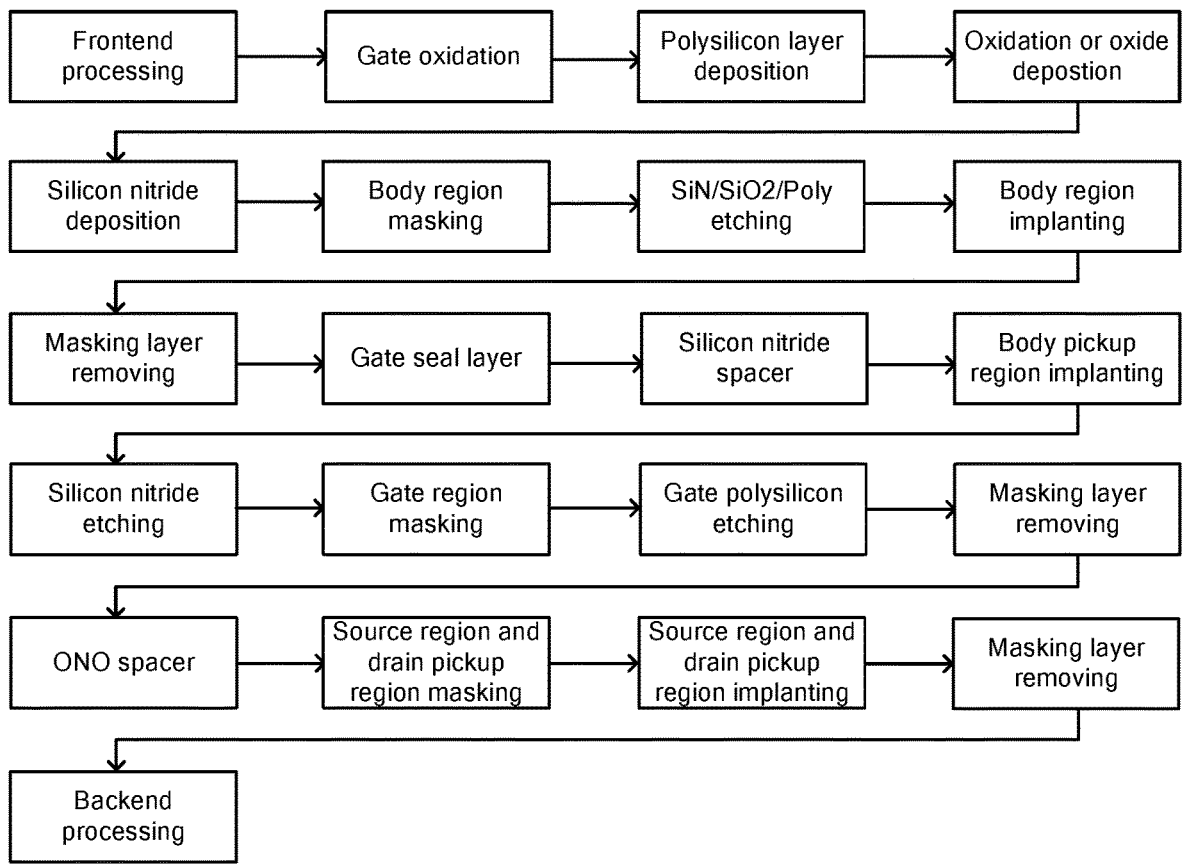
FIG. 4 shows a process flowchart outlining a manufacturing process that could be used to fabricate the DMOS device of FIGS. 3A-I in accordance with an embodiment of the present invention.

FIG. 4 shows a process flowchart outlining a manufacturing process that could be used to fabricate the devices of FIGS. 3A-I in accordance with an embodiment of the present invention. Compared to prior art process shown in FIG. 2, blocking spacers are formed at the side walls of the polysilicon layer in the window for the source/body region, to define position of source regions and a body pickup region in the body region. The thickness d2 of the blocking spacer could be controlled in a range of 0.1 μm~0.15 μm, so that the width of the source region could be controlled in the range of 0.1 μm~0.15 μm, which is much narrower than the source region width of the prior art process made DMOS device. The present invention adopts blocking spacers to define the very narrow N+/P+/N+ source/body region which cannot be achieved by conventional photo/masking equipment, and reduces at least one photo masking step.

It should be known that the doping type for each region may be in an alternating type, for example, the N type regions may be replaced with P type regions while the P type regions may be replaced with N type regions. In one embodiment as claimed in the appended claims, the first doping type may be N type and the second doping type may be P type. And in another embodiment, the first doping type is P type and the second doping type is N type.

The N type doping substance can be selected from one of the following: nitrogen, phosphorus, arsenic, antimony, bismuth and the combination thereof, while the P type doping substance can be selected from one of the following: boron, aluminum, gallium, indium, thallium and the combination thereof.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What is claimed is:

1. A manufacturing process of a DMOS device in a drift region of a first doping type in a semiconductor substrate, comprising:
   forming a polysilicon layer above the drift region;
   forming a block layer above the polysilicon layer;
   etching both the block layer and the polysilicon layer, through a window of a first masking layer to expose a window to the drift region;
   implanting dopants of a second doping type through the window to the drift region to form a body region;
   forming blocking spacers to wrap side walls of the polysilicon layer in a window of the polysilicon layer which is formed after etching;
   implanting dopants of the second doping type into the body region under a window shaped by the blocking spacers to form a body pickup region;
   etching away the blocking spacers;
   performing a masking step to form gates;
   forming ONO spacers to wrap side walls of the gates; and
   performing a masking step to form source regions and drain pickup regions.

2. The manufacturing process of claim 1, wherein the block layer has a faster etching rate than the polysilicon layer.

3. The manufacturing process of claim 1, wherein the blocking spacers have a same etching rate with the block layer.

4. The manufacturing process of claim 1, wherein the blocking spacers and the block layer are made of silicon nitride.

5. The manufacturing process of claim 1, further comprising forming a gate oxidation layer between the drift region and the polysilicon layer.

6. The manufacturing process of claim 1, further comprising forming a gate seal layer between the polysilicon layer and the block layer.

7. The manufacturing process of claim 1, wherein the side walls of the polysilicon layer in the window of the polysilicon layer is oxidized before forming the blocking spacers.

8. The manufacturing process of claim 1, wherein the thickness of each blocking spacer at the side walls of the polysilicon layer is in a range of 0.1 μm~0.15 μm.

9. The manufacturing process of claim 1, wherein the width of the body region is in a range of 0.3 μm~0.6 μm.

10. The manufacturing process of claim 1, wherein the width of the body region is in a range of 0.5 μm~0.6 μm.

11. A method for fabricating a DMOS device, comprising:
   etching a polysilicon layer above a drift region in a semiconductor substrate through windows for a body region;
   forming body regions through windows of the polysilicon layer which are formed after etching the polysilicon layer;
   forming blocking spacers at side walls of the polysilicon layer in the windows of the polysilicon layer which are formed after etching the polysilicon layer;
   forming body pickup regions through windows shaped by the blocking spacers;
   forming gates by a masking step after etching away the blocking spacers; and forming source regions and drain pickup regions by a masking step.

12. The method of claim 11, further comprising forming ONO spacers at side walls of the gates after forming the gates.

13. The method of claim 11, wherein the blocking spacers are made of silicon nitride.

14. The method of claim 11, wherein the thickness of each blocking spacer at the side walls of the polysilicon layer is in a range of 0.1 μm~0.15 μm.

15. The method of claim 11, wherein the width of the window for the body region is in a range of 0.5 μm~0.6 μm.

16. A manufacturing process of a DMOS device, comprising:
   forming a drift region in a semiconductor substrate;
   depositing a polysilicon layer above the drift region;
   depositing a silicon nitride layer above the polysilicon layer;
   etching both the silicon nitride layer and the polysilicon layer, through a window of a first masking layer to expose a window to the drift region;
   implanting P type dopants through the window to the drift region to form a body region;
   forming silicon nitride spacers to wrap side walls of the polysilicon layer in a window of the polysilicon layer which is formed after etching;
   implanting P type dopants into the body region under a window shaped by the silicon nitride spacers to form a body pickup region;
   etching away the silicon nitride spacers;
   performing a masking step to form a gate;
   forming ONO spacers to wrap side walls of the gates; and
   performing a masking step to form source regions and drain pickup regions.

17. The manufacturing process of claim 16, wherein the thickness of each silicon nitride spacer at the side walls of the polysilicon layer is in a range of 0.1 μm~0.15 μm.

18. The manufacturing process of claim 16, wherein the width of the body region is in a range of 0.3 μm~0.6 μm.

\* \* \* \* \*